United States Patent
Masuda et al.

(10) Patent No.: US 7,132,213 B2
(45) Date of Patent: Nov. 7, 2006

(54) POSITIVE PHOTORESIST COMPOSITION AND METHOD OF FORMING RESIST PATTERN

(75) Inventors: Yasuo Masuda, Kawasaki (JP); Toshiki Okui, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/564,453

(22) PCT Filed: Jul. 15, 2004

(86) PCT No.: PCT/JP2004/010434

§ 371 (c)(1),
(2), (4) Date: Jan. 12, 2006

(87) PCT Pub. No.: WO2005/007718

PCT Pub. Date: Jan. 27, 2005

(65) Prior Publication Data

US 2006/0166131 A1    Jul. 27, 2006

(30) Foreign Application Priority Data

Jul. 16, 2003 (JP) ............................. 2003-275051

(51) Int. Cl.
*G03F 7/023* (2006.01)
*G03F 7/30* (2006.01)

(52) U.S. Cl. .................. 430/190; 430/191; 430/192; 430/193; 430/326

(58) Field of Classification Search ............... 430/190, 430/191, 192, 193, 326
See application file for complete search history.

(56) References Cited

U.S. PATENT DOCUMENTS

| | | | | |
|---|---|---|---|---|
| 3,800,005 A | * | 3/1974 | Sherwood et al. | 525/502 |
| 3,860,561 A | * | 1/1975 | Vargiu et al. | 525/507 |
| 4,847,178 A | | 7/1989 | Komano | |
| 5,376,497 A | * | 12/1994 | Kawata et al. | 430/191 |
| 6,187,500 B1 | | 2/2001 | Miyagi et al. | |
| 6,319,853 B1 | | 11/2001 | Ishibashi et al. | |
| 2003/0059706 A1 | | 3/2003 | Misumi et al. | |

FOREIGN PATENT DOCUMENTS

| | | |
|---|---|---|
| EP | 0 650 091 A1 | 4/1995 |
| EP | 0 677 789 A1 | 10/1995 |
| JP | 47-43315 | 11/1972 |
| JP | 62-262043 | 11/1987 |
| JP | 05-107755 | 4/1993 |
| JP | 11-204399 | 7/1999 |
| JP | 11-223937 | 8/1999 |
| JP | 2002-258479 | 9/2002 |

OTHER PUBLICATIONS

Organic Compounds Structural Index, pp. 362-401, Dec. 20, 1977; Maruzen (Ltd.).

* cited by examiner

*Primary Examiner*—John S. Chu
(74) *Attorney, Agent, or Firm*—Knobbe Martens Olson & Bear LLP

(57) ABSTRACT

A positive photoresist composition comprising an alkali-soluble novolak resin (A) containing a structural unit (a1) represented by a general formula (I) shown below, and a structural unit (a2) represented by a general formula (II) shown below, and a photosensitizer (B)

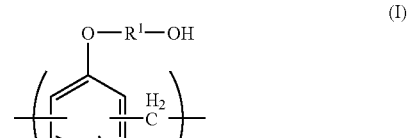

(I)

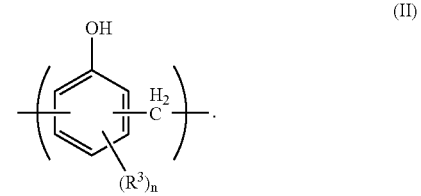

(II)

4 Claims, No Drawings

POSITIVE PHOTORESIST COMPOSITION AND METHOD OF FORMING RESIST PATTERN

This application is the U.S. National Phase under 35 U.S.C. §371 of International Application PCT/JP2004/010434, filed Jul. 15, 2004, which claims priority to Japanese Patent Application No. 2003-275051, filed Jul. 16, 2003. The International Application was published under PCT Article 21(2) in a language other than English.

TECHNICAL FIELD

The present invention relates to positive photoresist composition and a method of forming a resist pattern.

BACKGROUND ART

In recent years, as the size of electronic equipment has reduced, increases in the level of LSI integration and the shift to ASICs has progressed rapidly, and multiple pin thin film mounting is now demanded for installing LSIs in electronic equipment, and as a result, bare chip mounting using TAB methods and flip chip methods is attracting considerable attention. In such multiple pin mounting methods, connection terminals known as bumps, which are actually projection electrodes with a height of at least 20 μm, must be arranged on the substrate with a high level of precision, and as LSIs are further miniaturized in the future, even greater levels of precision will be needed in positioning these bumps.

Furthermore, in order to aid the formation of these connection terminals, a second wiring step may be conducted for forming the wiring between the chip and the connection terminals.

Photoresists are used for forming the above connection terminals and wiring. In order to be usable within this type of application, a photoresist must be capable of forming a thick film with a thickness of at least 5 μm, for example from 5 to 20 μm, on top of the substrate. Furthermore, the photoresist must also display good adhesion to the substrate, good plating solution resistance and favorable wetting characteristics relative to the plating solution during the plating process used for forming the connection terminals and wiring, and easy removal by a stripping solution following completion of the plating process.

Furthermore, as LSIs reach even higher levels of integration, meaning the connection terminals and wiring that must be formed become even smaller, and the pitch between terminals must become even narrower, photoresists that are capable of forming space patterns with high resolution and good perpendicularity of the resist pattern side walls are becoming increasingly necessary.

As such photoresists, positive photoresist compositions comprising mainly an alkali-soluble novolak resin, and a quinonediazide group containing compound as a photosensitizer, are currently the most widely used.

However, when these types of positive photoresist compositions are used for forming a resist pattern, and a plating treatment such as gold plating is then performed to form the connection terminals and wiring pattern (the plating pattern), a problem arises in that the resist pattern develops cracks.

Because the generation of these types of cracks can cause shape abnormalities within the formed plating pattern, methods have been proposed for suppressing the generation of cracks by adding a plasticizer such as an acrylic resin to the positive photoresist composition. For example, patent reference 1 (Japanese Unexamined Patent Application, First Publication No. 2002-258479) discloses a positive photoresist composition for forming thick films, comprising an alkali-soluble novolak resin, a quinonediazide group containing compound, and an alkali-soluble acrylic resin as a plasticizer.

However, when a positive photoresist composition containing an added plasticizer is used, a variety of problems arise, including a reduction in resolution, and pattern broadening wherein the dimensions of the resist pattern following the plating process, that is, the dimensions of the plating pattern produced, are larger than the dimensions of the resist pattern immediately following developing.

An object of the present invention is to provide a positive photoresist composition capable of improving pattern broadening, and capable of forming a resist pattern with excellent resolution and good suppression of crack generation during plating, as well as a method of forming a resist pattern using such a positive photoresist composition.

DISCLOSURE OF INVENTION

A first aspect of the present invention provides a positive photoresist composition comprising an alkali-soluble novolak resin (A) containing a structural unit (a1) represented by a general formula (I) shown below:

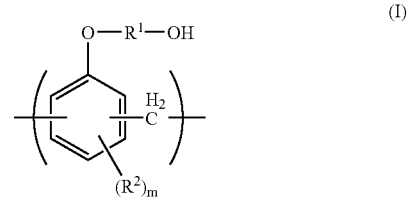

[wherein, $R^1$ represents an alkylene group of 1 to 5 carbon atoms, $R^2$ represents a hydrogen atom, a hydroxyl group, or an alkyl group of 1 to 4 carbon atoms, and m represents an integer of 1 to 3], and a structural unit (a2) represented by a general formula (II) shown below:

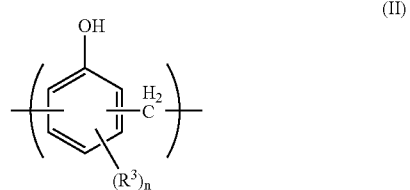

[wherein, $R^3$ represents a hydrogen atom, a hydroxyl group, or an alkyl group of 1 to 4 carbon atoms, and n represents an integer of 1 to 3], and a photosensitizer (1).

A second aspect of the present invention provides a positive photoresist composition comprising an alkali-soluble novolak (A') resin containing a structural unit (a1) represented by a general formula (I) shown below:

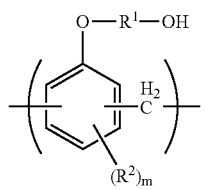

(I)

[wherein, $R^1$ represents an alkylene group of 1 to 5 carbon atoms, $R^2$ represents a hydrogen atom, a hydroxyl group, or an alkyl group of 1 to 4 carbon atoms, and m represents an integer of 1 to 3], and a structural unit (a2) represented by a general formula (II) shown below:

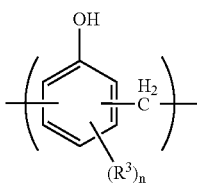

(II)

[wherein, $R^3$ represents a hydrogen atom, a hydroxyl group, or an alkyl group of 1 to 4 carbon atoms, and n represents an integer of 1 to 3], wherein a portion of the hydrogen atoms of the hydroxyl groups contained within the resin are substituted with 1,2-naphthoquinonediazidesulfonyl groups.

A third aspect of the present invention is a method of forming a resist pattern comprising the steps of applying a positive photoresist composition according to either aspect 1 or aspect 2 described above to a substrate, conducting a prebake, performing selective exposure, and then performing alkali developing to form the resist pattern.

By using a positive photoresist composition as described above, a resist pattern with excellent resolution and good suppression of crack generation during plating can be formed, and pattern broadening of the plating pattern can be reduced.

BEST MODE FOR CARRYING OUT THE INVENTION

As follows is a more detailed description of the present invention.

Positive Photoresist Composition

A positive photoresist composition of a first aspect of the present invention comprises an alkali-soluble novolak resin (A) containing specific structural units (hereafter referred to as the component (A)) and a photosensitizer (B) (hereafter referred to as the component (B)).

Furthermore, a second aspect of the present invention comprises an alkali-soluble novolak resin (A') (hereafter referred to as the component (A')), in which a portion of the hydrogen atoms of the hydroxyl groups contained within the above component (A) have been substituted with 1,2-naphthoquinonediazidesulfonyl groups.

In the second aspect, the component (B) is an optional component.

In this description, the term "structural unit" refers to a monomer unit within a polymer.

<Component (A)>

The component (A) contains a structural unit (a1) represented by the above general formula (I) and a structural unit (a2) represented by the above general formula (II).

Specifically, the component has a structure in which a portion of the phenolic hydroxyl groups of a novolak resin produced by reacting a phenol with an aldehyde have undergone hydroxyalkyl etherification.

In the above general formula (I), $R^1$ is an alkylene group of 1 to 5 carbon atoms, and specific examples of the alkylene group include a methylene group, ethylene group, n-propylene group, isopropylene group, n-butylene group, isobutylene group, n-pentylene group, and an isopentylene group. Of these, an ethylene group or an isopropylene group is preferred. Such groups mean that when the positive photoresist composition is used to form a resist pattern, the cracking resistance can be improved with no loss in the solubility in the developing liquid.

In the general formulas (I) and (II), $R^2$ and $R^3$ each represent, independently, a hydrogen atom, a hydroxyl group, or an alkyl group of 1 to 4 carbon atoms. Examples of alkyl groups of 1 to 4 carbon atoms include methyl groups, ethyl groups, n-propyl groups, isopropyl groups, n-butyl groups, and tert-butyl groups.

Furthermore, m and n each represent, independently, an integer from 1 to 3.

Of the possible combinations, structures in which $R^2$ and $R^3$ are methyl groups and m, n=1 are preferred. This ensures that a favorable level of sensitivity can be imparted to the positive photoresist composition, and also enables adjustments of properties such as the solubility in the developing liquid and film thinning to be performed with comparative ease.

In those cases where $R^2$ and $R^3$ are methyl groups and m, n=1, there are no particular restrictions on the bonding positions of $R^2$ and $R^3$, although structures in which the groups are in the meta position or the para position relative to the oxygen atom bonded to the aromatic ring are preferred. Furthermore, in the component (A), the ratio between structures in which this bonding position is the meta position and those in which it is the para position (that is, the meta position/para position ratio) is preferably within a range from 3/7 to 8/2. This ensures that the effects described above are enhanced even further.

This bonding position ratio can be measured using an NMR device or the like. Alternatively, a component (A) containing the above ratio can be produced by adjusting the proportions of the phenol monomers used in the production of the component (A) described below.

In the component (A), the ratio (molar ratio) between the structural unit (a1) and the structural unit (a2) is preferably within a range from 1:99 to 80:20. If the proportion of the structural unit (a1) is less than the above lower limit, then the cracking resistance improvement effect of the photoresist tends to weaken, whereas if the proportion exceeds the upper limit, the solubility of the composition in alkali developing liquids decreases, and either the sensitivity tends to be unsatisfactory, or the pattern broadening caused by the plating tends to increase. In order to achieve a good balance of these characteristics, ratios within a range from 5:95 to 40:60 are even more desirable.

The ratio of the above structural units can also be measured using an NMR device or the like. Alternatively, a component (A) containing the above ratio can be produced by adjusting the reaction rate (the relative quantities added) of the novolak resin and the hydroxyalkyl etherification agent during the production of the component (A) described below. This is because the phenolic hydroxyl groups of the novolak resin and the hydroxyalkyl etherification agent undergo a substantially stoichiometric reaction.

In the component (A), there are no particular restrictions on the state of the bonding between the two different structural units, namely the structural unit (a1) and the structural unit (a2). In other words, random polymers in which the two types of structural units are bonded randomly, block polymers in which one of the structural units is bonded in a continuous chain, or structures in which a portion of a random polymer is bonded to a block polymer are all acceptable, provided the two structural units have the structures described above and are bonded together to form a polymer.

The component (A) preferably has a polystyrene equivalent weight average molecular weight (Mw), as determined by gel permeation chromatography (GPC), within a range from 500 to 30,000. This ensures that the developing characteristics, the resolution and the plating solution resistance of the photoresist are all at preferred levels. If the weight average molecular weight is less than the above lower limit, then severe film thinning occurs, making the formation of a resist pattern far more difficult. In contrast, if the molecular weight exceeds the upper limit, then the sensitivity and the resolution tend to worsen markedly. Because of these effects, weight average molecular weight values from 1,000 to 25,000 are even more desirable.

The weight average molecular weight is determined by a GPC measurement using the GPC apparatus described below, under conditions including the use of tetrahydrofuran as the eluting solvent, a flow rate of 0.1 ml/minute, and a column temperature of 40° C., and is calculated on the basis of a calibration curve prepared using a polystyrene standard material.

Apparatus: HLC-8020, manufactured by Tosoh Corporation
Detector: UV-8011, manufactured by Tosoh Corporation, set to a wavelength of 280 nm
Analysis column: Shodex KF-802, KF-803, KF-805, manufactured by Showa Denko Co., Ltd.

As follows is a description of a method of producing the component (A).

The component (A) can be produced by reacting a phenol and an aldehyde to synthesize a novolak resin, and then subjecting a portion of the phenolic hydroxyl groups of this novolak resin to hydroxyalkyl etherification.

There are no particular restrictions on the novolak resin, although resins obtained by conducting a condensation reaction of 0.5 to 1.0 mols of aldehyde per 1 mol of phenol in the presence of an acid catalyst are preferred.

Examples of the phenols that can be used include phenol, cresols such as o-cresol, m-cresol and p-cresol, xylenols such as 2,3-xylenol, 2,4-xylenol, 2,5-xylenol, 2,6-xylenol, 3,4-xylenol, and 3,5-xylenol, ethylphenols such as o-ethylphenol, m-ethylphenol and p-ethylphenol, alkylphenols such as isopropylphenol, butylphenol and p-tert-butylphenol, polyhydric phenols such as resorcinol, catechol, hydroquinone, pyrogallol and phloroglucinol, and alkyl polyhydric phenols such as alkylresorcinols, alkylcatechols and alkylhydroquinones (wherein, all alkyl groups are from 1 to 4 carbon atoms). These phenols can be used singularly, or in combinations of two or more different compounds.

Of the above phenols, m-cresol and p-cresol are particularly preferred. By using these phenols, and adjusting the ratio between the two, the characteristics of the photoresist such as the sensitivity and the heat resistance can be adjusted.

When m-cresol and p-cresol are used as the phenol, there are no particular restrictions on the relative proportions of each (the molar ratio), although a m-cresol/p-cresol ratio of 3/7 to 8/2 is preferred. If the proportion of m-cresol is less than the lower limit of this range, then the sensitivity tends to decrease, whereas if the proportion exceeds the upper limit, the heat resistance can deteriorate.

As the aforementioned aldehyde, the use of formaldehyde and paraformaldehyde is preferred in terms of the product characteristics achieved.

There are no particular restrictions on the aforementioned acid catalyst, and suitable examples include inorganic acids such as hydrochloric acid, sulfuric acid, phosphoric acid and phosphorous acid, organic acids such as oxalic acid, diethylsulfuric acid, para-toluenesulfonic acid and organic sulfonic acids, and metal salts such as zinc acetate. These acid catalysts can be used singularly, or in combinations of two or more different materials.

Hydroxyalkyl etherification is conducted by reacting the novolak resin obtained in the manner described above, with a hydroxyalkyl etherification agent.

As the hydroxyalkyl etherification, a cyclic carbonate ester compound represented by a general formula (III) shown below is normally used.

In the formula (III), $R^4$ represents an alkylene group of 1 to 5 carbon atoms, and specific examples of the alkylene group include a methylene group, ethylene group, n-propylene group, isopropylene group, n-butylene group, isobutylene group, n-pentylene group, and an isopentylene group. Of these, an ethylene group or an isopropylene group is preferred. If the number of carbon atoms within the alkylene group is 6 or greater, then the solubility in the alkali developing liquid can decrease, causing a reduction in the sensitivity of the photoresist.

The hydroxyalkyl etherification reaction can be carried out in accordance with known methods, such as the method disclosed in Japanese Examined Patent Application, Second Publication No. Sho 47-43315. Specifically, the novolak resin obtained above is heated and melted, a cyclic carbonate ester compound described above is added, and the mixture is reacted at 160 to 220° C. for a period of 1 to 6 hours. This causes a portion of the phenolic hydroxyl groups within the novolak resin to undergo hydroxyalkyl etherification.

Following completion of the reaction, the acid catalyst is neutralized, the product is washed with water, and an operation is conducted for removing any remaining monomer, thus yielding the component (A).

There are no particular restrictions on the quantity added of the hydroxyalkyl etherification agent, and the quantity can be selected appropriately in accordance with the desired proportion of hydroxyalkyl groups to be introduced at the phenolic hydroxyl groups of the novolak resin. Specifically, the quantity of the hydroxyalkyl etherification agent is preferably within a range from 0.01 to 0.80 mols, and even more preferably from 0.05 to 0.40 mols, per 1 mol of phenolic hydroxyl groups within the novolak resin. Such a quantity ensures that a component (A) is obtained with the desired level of hydroxyalkyl etherification of the phenolic hydroxyl groups.

<Component (A')>

The component (A') is a resin in which a portion of the hydrogen atoms of the hydroxyl groups contained within the component (A) have been substituted with 1,2-naphthoquinonediazidesulfonyl groups. When the component (A') is used, because the limited quantity of naphthoquinonediazidesulfonyl groups of the component (A') display photosensitivity, the sensitivity of the photoresist composition can be further improved.

The substitution with 1,2-naphthoquinonediazidesulfonyl groups can be achieved, for example, by an esterification reaction between a component (A) produced in the manner described above, and a 1,2-naphthoquinonediazidesulfonic acid compound. Examples of 1,2-naphthoquinonediazidesulfonic acid compounds that can be used include halides of quinonediazide compounds such as 1,2-naphthoquinonediazide-4-sulfonyl chloride and 1,2-naphthoquinonediazide-5-sulfonyl chloride.

The proportion of hydrogen atoms substituted with 1,2-naphthoquinonediazidesulfonyl groups, in other words the reaction rate from the esterification reaction, is preferably within a range from 2 to 10 mol %, and even more preferably from 3 to 7 mol %, and most preferably from 3 to 5 mol %. If this reaction rate is less than 2 mol %, then film thinning of the unexposed portions tends to increase, causing an undesirable increase in the danger of expansion of the upper sections of the pattern during formation of a space pattern, whereas if the rate exceeds 10 mol %, the transmittance of g-line, h-line and i-line radiation falls, causing a marked deterioration in sensitivity and an expansion of the upper sections of the space pattern, which result in an undesirable deterioration in the perpendicularity of the cross sectional shape of the pattern.

<Component (B)>

Examples of the component (B) include naphthoquinonediazide esterification products. There are no particular restrictions on these naphthoquinonediazide esterification products, and either one, or two or more, of those compounds typically used as photosensitizers in positive photoresist compositions can be used.

Examples include esterification products of a naphthoquinonediazidesulfonic acid compound and a phenol compound represented by a general formula (b-1) shown below.

$Q^1$ is either a hydrogen atom, an alkyl group of 1 to 6 carbon atoms, or a residue represented by a chemical formula (b-2) shown below:

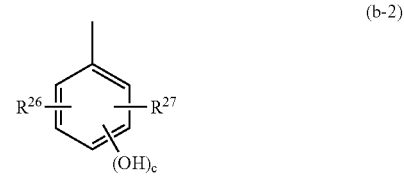

(wherein, $R^{26}$ and $R^{27}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms; and c represents an integer from 1 to 3), or alternatively, $Q^1$ can be bonded to the terminal of $R^{21}$, and in such cases, $Q^1$ and $R^{21}$, together with the carbon atoms between $Q^1$ and $R^{21}$, form a cycloalkyl group of 3 to 6 carbon atoms; a and b each represent an integer from 1 to 3; and d and e each represent an integer from 0 to 3; although when a, b, d or e is 3, then $R^{13}$, $R^{16}$, $R^{18}$ or $R^{20}$ respectively does not exist; and h and i represent integers such that h+i is from 0 to 3]

In those cases where $Q^1$, together with $R^{21}$ and the carbon atoms between $Q^1$ and $R^{21}$, forms a cycloalkyl group of 3 to 6 carbon atoms, $Q^1$ and $R^{21}$ are bonded together and form an alkylene group of 2 to 5 carbon atoms.

Of the above compounds, phenol compounds represented by the formula (b-3) shown below are preferred.

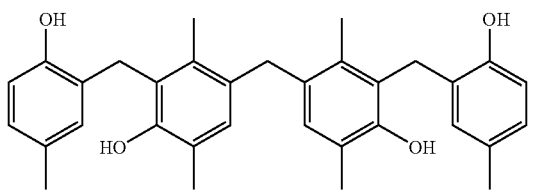

Furthermore, examples of phenol compounds corresponding with the general formula (b-1) other than the phenol compounds of the formula (b-3) include:

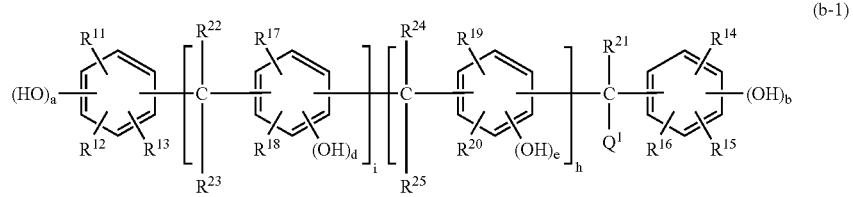

[wherein, $R^{11}$ to $R^{20}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms; $R^{22}$ to $R^{25}$ each represent, independently, a hydrogen atom, or an alkyl group of 1 to 6 carbon atoms; $R^{21}$ can be either a hydrogen atom or an alkyl group of 1 to 6 carbon atoms, and in such cases, tris-phenol type compounds such as tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane;

linear trinuclear phenol compounds such as 2,4-bis(3,5-dimethyl-4-hydroxybenzyl)-5-hydroxyphenol, and 2,6-bis(2,5-dimethyl-4-hydroxybenzyl)-4-methylphenol;

linear tetranuclear phenol compounds such as 1,1-bis[3-(2-hydroxy-5-methylbenzyl)-4-hydroxy-5-cyclohexylphenol]isopropane, bis[2,5-dimethyl-3-(4-hydroxy-5-methylbenzyl)-4-hydroxyphenyl]methane, bis [2,5-dimethyl-3-(4-hydroxybenzyl)4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane;

linear polyphenol compounds including linear pentanuclear phenol compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol;

bisphenol type compounds such as bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane;

polynuclear branched compounds such as 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; and condensation type phenol compounds such as 1,1-bis(4-hydroxyphenyl)cyclohexane.

These compounds can be used singularly, or in combinations of two or more different compounds.

The naphthoquinonediazidesulfonic acid esterification of either all, or a portion, of the phenolic hydroxyl groups of the compound represented by the above general formula (b-1) can be performed using normal methods.

For example, the esterification product can be obtained by condensing naphthoquinonediazidesulfonyl chloride with the compound represented by the general formula (b-1).

Specifically, predetermined quantities of the compound represented by the general formula (b-1) and naphthoquinone-1,2-diazide-4 (or -5)-sulfonyl chloride are dissolved in an organic solvent such as dioxane, n-methylpyrrolidone, dimethylacetamide or tetrahydrofuran, one or more basic catalysts such as triethylamine, triethanolamine, pyridine, an alkali carbonate or an alkali hydrogencarbonate are then added and reacted, and the resulting product is washed in water and dried to yield the final product.

As the component (B), other naphthoquinonediazide esterification products not among the preferred naphthoquinonediazide esterification products listed above can also be used, and for example, the products of esterification reactions between phenol compounds such as polyhydroxybenzophenone or gallic acid and a naphthoquinonediazidesulfonic acid compound can be used.

From the viewpoint of achieving the maximum effect from the present invention, the quantity used of these other naphthoquinonediazide esterification products is typically no more than 80% by mass, and preferably no more than 50% by mass, of the component (B).

The quantity of the component (B) within the positive photoresist composition is preferably within a range from 5 to 40% by mass, and even more preferably from 10 to 20% by mass, relative to the component (A) in those cases where the component (A) is used as the base resin. If the quantity of the component (B) is less than the lower limit of this range, then film thinning of the unexposed portions tends to increase, and in the example of a space pattern, the upper sections of the pattern tend to expand undesirably. Furthermore, if the quantity exceeds the upper limit of the above range, then the transmittance of g-line, h-line and i-line radiation falls, causing a marked deterioration in sensitivity.

In those cases where the component (A') is used, the component (B) is not essential and may account for 0% by mass, although if the component (B) is added, the quantity added is preferably within a range from 1 to 10% by mass, and even more preferably from 2 to 5% by mass, relative to the component (A').

<Other Components>

Where necessary, plasticizers such as alkali-soluble acrylic resins, adhesion improvement agents for improving adhesion to the substrate, sensitizers, high boiling point organic solvents, acid generators, or a variety of other additives typically used in this field may also be added to a positive photoresist composition of the present invention.

Alkali-Soluble Acrylic Resins

In order to further improve the plating resistance to the generation of cracks and the like, the positive photoresist composition of the present invention may also comprise an alkali-soluble acrylic resin (hereafter referred to as the component (C)) as a plasticizer.

As the component (C), those materials-typically used as plasticizers within positive photoresist compositions can be used.

Specific examples of the component (C) include materials comprising from 30 to 90% by mass of structural units derived from a polymerizable compound with an ether linkage, and from 50 to 2% by mass of structural units derived from a polymerizable compound with a carboxyl group.

Examples of the polymerizable compound with an ether linkage include radical polymerizable compounds such as (meth)acrylic acid derivatives containing an ether linkage and an ester linkage, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate, and of these, 2-methoxyethyl acrylate and methoxytriethylene glycol acrylate are preferred. These compounds can be used singularly, or in combinations of two or more different compounds.

Examples of the polymerizable compound with a carboxyl group include radical polymerizable compounds such as monocarboxylic acids such as acrylic acid and methacrylic acid, dicarboxylic acids such as maleic acid, fumaric acid and itaconic acid, and methacrylic acid derivatives containing a carboxyl group and an ester linkage such as 2-methacryloyloxyethylsuccinic acid, 2-methacryloyloxyethylmaleic acid, 2-methacryloyloxyethylphthalic acid and 2-methacryloyloxyethylhexahydrophthalic acid, and of these, acrylic acid and methacrylic acid are preferred. These compounds can be used singularly, or in combinations of two or more different compounds.

The quantity of the polymerizable compound containing an ether linkage within the component (C) is preferably within a range from 30 to 90% by mass, and even more preferably from 40 to 80% by mass. If this quantity exceeds 90% by mass, then the co-solubility of the component (C) in the solution of the component (A) deteriorates, Benard cells (a non-uniform network pattern of 5 to 7 sided polygons that develops on the film surface due to gravitational effects or surface tension gradients) develop during prebaking, and the production of a uniform resist film becomes more difficult, whereas if the quantity is less than 30% by mass, cracks tend to develop during plating.

Furthermore, the quantity of the polymerizable compound containing a carboxyl group within the component (C) is preferably within a range from 2 to 50% by mass, and even more preferably from 5 to 40% by mass. If this quantity is less than 2% by mass, then the alkali solubility of the component (C) tends to decrease, meaning satisfactory developing characteristics cannot be achieved, and the film peelability also deteriorates, meaning residual resist film tends to remain on the substrate. If the quantity exceeds 50% by mass, then the film residual rate following developing tends to decrease, and the plating resistance also tends to deteriorate.

The weight average molecular weight of the component (C) is preferably within a range from 10,000 to 800,000, and even more preferably from 30,000 to 500,000. If this value is less than 10,000, then the resist film does not develop sufficient strength, which tends to cause problems such as profile collapse and crack generation during plating. If the molecular weight exceeds 800,000, then the peelability tends to deteriorate.

In order to appropriately control certain physical and chemical characteristics, the component (C) may also comprise other radical polymerizable compounds as monomers. In this description "other radical polymerizable compounds" refers to radical polymerizable compounds other than the polymerizable compounds described above.

Examples of such other radical polymerizable compounds include (meth)acrylate esters such as methyl (meth)acrylate, ethyl (meth)acrylate and butyl (meth)acrylate; hydroxyalkyl (meth)acrylate esters such as 2-hydroxyethyl (meth)acrylate and 2-hydroxypropyl (meth)acrylate; aryl (meth)acrylate esters such as phenyl (meth)acrylate and benzyl (meth)acrylate; diesters of dicarboxylic acids such as diethyl maleate and dibutyl fumarate; vinyl group containing aromatic compounds such as styrene and α-methylstyrene; vinyl group containing aliphatic compounds such as vinyl acetate; conjugated diolefins such as butadiene and isoprene; nitrile group containing polymerizable compounds such as acrylonitrile and methacrylonitrile; chlorine containing polymerizable compounds such as vinyl chloride and vinylidene chloride; and amide linkage containing polymerizable compounds such as acrylamide and methacrylamide. These compounds can be used singularly, or in combinations of two or more different compounds, and of these compounds, n-butyl acrylate, benzyl methacrylate and methyl methacrylate and the like are preferred. These other radical polymerizable compounds preferably account for less than 50% by mass of the component (C), and even more preferably less than 40% by mass.

As the polymerization solvent used during synthesis of the component (C), alcohols such as ethanol and diethylene glycol; alkyl ethers of polyhydric alcohols such as ethylene glycol monomethyl ether, diethylene glycol monomethyl ether and diethylene glycol ethyl methyl ether; alkyl ether acetates of polyhydric alcohols such as ethylene glycol ethyl ether acetate and propylene glycol methyl ether acetate; aromatic hydrocarbons such as toluene and xylene; ketones such as acetone and methyl ethyl ketone; and esters such as ethyl acetate and butyl acetate can be used. Of these, alkyl ethers of polyhydric alcohols and alkyl ether acetates of polyhydric alcohols are particularly preferred.

As the polymerization catalyst used during synthesis of the component (C), typical radical polymerization initiators can be used, and suitable examples include azo compounds such as 2,2'-azobisisobutyronitrile; and organic peroxides such as benzoyl peroxide and di-tert-butyl peroxide.

In a positive photoresist composition of the present invention, the quantity of the component (C) is preferably no more than 13 parts by mass, and even more preferably no more than 7 parts by mass, per 100 parts by mass of the component (A) or the component (A'). Conventionally, plasticizers of the component (C) are typically added in quantities of 15 to 25 parts by mass per 100 parts by mass of the base resin, but in the present invention, by using the aforementioned component (A) as the base resin, a satisfactory plasticizing effect can be achieved with quantities of no more than 13 parts by mass.

Furthermore, by restricting the quantity to no more than 13 parts by mass, satisfactory strength can be ensured for the formed resist film, collapse becomes less likely, and a well-defined profile can be obtained, enabling an improvement in the resolution.

The component (C) is not essential, and may be excluded if desired, although if added, is preferably included in quantities of at least 3 parts by mass per 100 parts by mass of the component (A) or the component (A').

Adhesion Improvement Agents

Examples of adhesion improvement agents include those adhesion improvement agents disclosed in Japanese Unexamined Patent Application, First Publication No. Sho 62-262043 and Japanese Unexamined Patent Application, First Publication No. Hei 11-223937, and specific examples include 6-methyl-8-hydroxyquinoline, 6-ethyl-8-hydroxyquinoline, 5-methyl-8-hydroxyquinoline, 8-hydroxyquinoline, 8-acetyloxyquinoline, 4-hydroxypteridine, 2,4-dihydroxypteridine, 4-hydroxypteridine-2-sulfonic acid, 2-ethyl-4-hydroxypteridine, 2-methyl-4-hydroxypteridine, 1,10-phenanthroline, 5,6-dimethyl-1,10-phenanthroline, 3,8-dimethyl-1,10-phenanthroline, 3,8-dihydroxy-1,10-phenanthroline, 5-carboxy-1,10-phenanthroline, 5,6-dihydroxy-1,10-phenanthroline, 1,10-phenanthroline-5-sulfonic acid, 4,4'-dimethyl-2,2'-bipyridyl, 2,2'-bipyridyl, 2,2'-bipyridyl-5-carboxylic acid, 5,5'-dichloro-2,2'-bipyridyl, 3,3'-dihydroxy-2,2'-bipyridyl, and 3,3'-dimercapto-2,2'-bipyridyl.

Furthermore, by incorporating an aromatic heterocyclic compound which contains, within the ring structure, at least one of the linkages represented by the general formulas (d-1) and (d-2) shown below, and at least one linkage represented by the general formula (d-3) shown below, the adhesion of the positive photoresist composition to the substrate can be improved markedly.

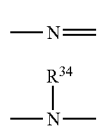
(d-1)
(d-2)

(wherein, $R^{34}$ represents a hydrogen atom or an alkyl group of 1 to 3 carbon atoms)

(d-3)

(wherein, $R^{35}$ represents a hydroxyl group, or a straight chain or branched alkyl group of 1 to 5 carbon atoms containing a hydroxyl group substituent)

Examples of the aforementioned heterocyclic compound include compounds with a 5-membered ring skeleton with one nitrogen atom such as the indole based compounds, indoline based compounds and indigo based compounds disclosed on pp. 362 to 401 of "Organic Compounds Structural Index" (published by Maruzen (Ltd.), 20 Dec. 1977); compounds with a 6-membered ring skeleton with one nitrogen atom such as pyridine based compounds, quinoline based compounds, hydroquinoline based compounds, isoquionoline based compounds, acridine based compounds, benzoquinoline based compounds, naphthoquinoline based compounds, and phenanthroline based compounds; compounds with a 5-membered ring skeleton with two nitrogen atoms such as pyrazole based compounds, imidazole based compounds, imidazoline based compounds, and benzoimidazole based compounds; compounds with a 6-membered ring skeleton with two nitrogen atoms such as diazine based compounds, hydropyridine based compounds, benzodiazine based compounds, and dibenzodiazine based compounds; compounds with a 5-membered ring skeleton with three nitrogen atoms such as triazole based compounds and benzotriazole based compounds; compounds with a 6-membered ring skeleton with three nitrogen atoms such as triazine based compounds; compounds with a 5-membered ring skeleton with four nitrogen atoms such as tetrazole and pentetrazole; compounds with a 6-membered ring skeleton with four nitrogen atoms such as 1,2,4,5-tetrazine; as well as other compounds such as purine based compounds, pteridine based compounds, alloxazine based compounds, and 2H-pyrrole. Of these, compounds represented by the general formula (d-4) shown below are preferred as they suppress the generation of scum, and enable the provision of a positive photoresist composition with excellent adhesion to the substrate. 2-(2-hydroxyethyl)pyridine is particularly preferred.

(d-4)

(wherein, k represents an integer from 1 to 3, and $R^{35}$ is as defined above)

The quantity added of the adhesion improvement agent is typically within a range from 0.1 to 1.0% by mass, and preferably from 0.2 to 0.7% by mass relative to the combined quantity of the component (A) or the component (A'), and if added, the component (C). If the quantity is less than 0.1% by mass, then the improvement in the adhesion of the positive photoresist composition to the substrate is inadequate, whereas if the quantity exceeds 1.0% by mass, then the resolution deteriorates and the upper sections of the space pattern tend to expand, and furthermore, a small amount of undesirable scum also develops on the substrate following developing.

Sensitizers

Furthermore in the present invention, sensitizers may also be added as required. There are no particular restrictions on the materials used as sensitizers in the present invention, and any of the compounds typically used as sensitizers in positive photoresist compositions can be used. For example, phenol compounds represented by a general formula (e-1) shown below can be used.

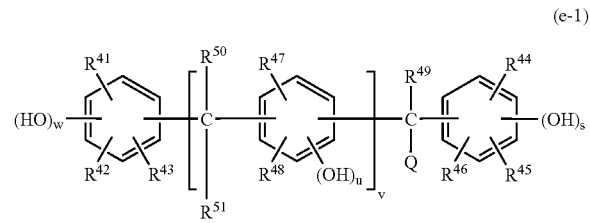
(e-1)

[wherein, $R^{41}$ to $R^{48}$ each represent, independently, a hydrogen atom, a halogen atom, an alkyl group of 1 to 6 carbon atoms, an alkoxy group of 1 to 6 carbon atoms, or a cycloalkyl group; $R^{50}$ and $R^{51}$ each represent, independently, a hydrogen atom, or an alkyl group of 1 to 6 carbon atoms; $R^{49}$ can be either a hydrogen atom or an alkyl group of 1 to 6 carbon atoms, and in such cases, Q is either a hydrogen atom, an alkyl group of 1 to 6 carbon atoms, or a residue represented by a chemical formula (e-2) shown below:

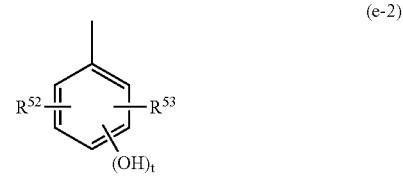
(e-2)

(wherein, $R^{52}$ and $R^{53}$ each represent, independently, a hydrogen atom, a halogen atom, an alkyl group of 1 to 6 carbon atoms, an alkoxy group of 1 to 6 carbon atoms, or a cycloalkyl group; and t represents an integer from 1 to 3), or alternatively, Q can be bonded to the terminal of $R^{49}$, and in such cases, Q and $R^{49}$, together with the carbon atoms between Q and $R^{49}$, form a cycloalkyl group with a carbon chain of 3 to 6 atoms; w and s each represent an integer from 1 to 3; and u represents an integer from 0 to 3; although when w, s, or u is 3, then $R^{43}$, $R^{46}$, or $R^{48}$ respectively do not exist; and v represents an integer from 0 to 3]

Specific examples of the phenol compounds represented by the general formula (e-1) include bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcinol, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. In addition, other compounds such as 6-hydroxy-4a-(2,4-dihydroxyphenyl)-9-1'-spirocyclohexyl-1,2,3,4,4a,9a-hexahydroxanthene and 6-hydroxy-5-methyl-4a-(2,4-dihydroxy-3-methylphenyl)-9-1'-spirocyclohexyl-1,2,3,4,4a,9a-hexahydroxanthene can also be used. These sensitizers can be used singularly, or in combinations of two or more different compounds, and of the above compounds, a combination of 1-[1-(4-hydroxyphenyl)isopropyl]-4-[1,1-bis(4-hydroxyphenyl)ethyl]benzene and bis(4-hydroxy-2,3,5-trimethylphenyl)-2-hydroxyphenylmethane is preferred as it produces higher sensitivity and excellent perpendicularity of the space pattern.

Furthermore, as the sensitizer, phenol compounds represented by a general formula (e-3) shown below can also be used.

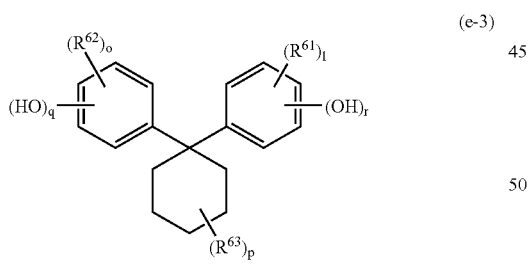

(e-3)

In the general formula (e-3), $R^{61}$ to $R^{63}$ each represent, independently, a lower alkyl group (which may be either a straight chain or a branched group, but preferably contains from 1 to 5 carbon atoms, and even more preferably from 1 to 3 carbon atoms), a cycloalkyl group (preferably of 5 to 7 carbon atoms), or a lower alkoxy group (which may be either a straight chain or a branched group, but preferably contains from 1 to 5 carbon atoms, and even more preferably from 1 to 3 carbon atoms).

q and r each represent an integer from 1 to 3, and preferably from 1 to 2.

l, o and p each represent either 0, or an integer from 1 to 3.

More specific examples of the phenol compounds represented by the general formula (e-3) include the compounds represented by the formulas (e-4) to (e-8) shown below.

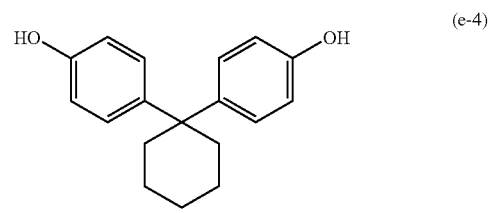

(e-4)

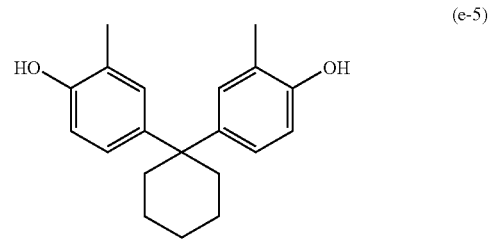

(e-5)

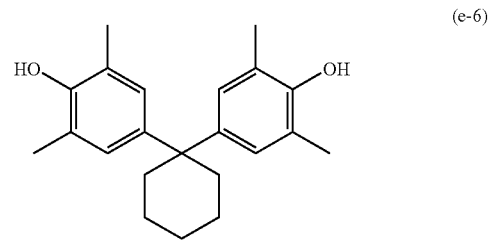

(e-6)

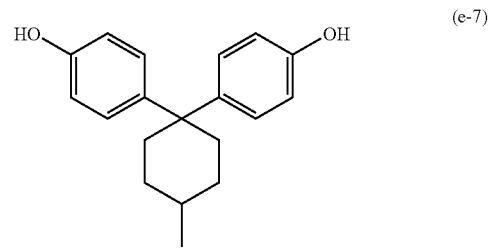

(e-7)

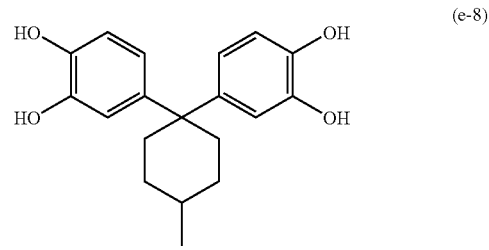

(e-8)

As the sanitizer, phenol compounds represented by a general formula (e-9) shown below can also be used.

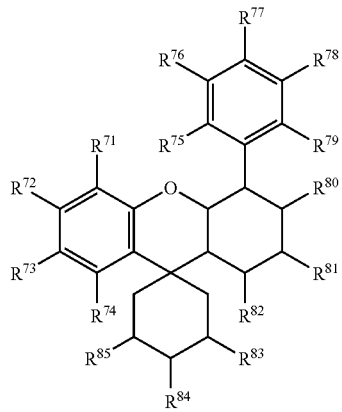
(e-9)

In the general formula (e-9), $R^{71}$ to $R^{79}$ each represent, independently, a hydrogen atom, an alkyl group, a halogen atom or a hydroxyl group. At least one of $R^{71}$ to $R^{79}$ must be a hydroxyl group, and in a preferred configuration, at least one of $R^{71}$ to $R^{74}$ and at least one of $R^{75}$ to $R^{79}$ are hydroxyl groups. The alkyl groups of $R^{71}$ to $R^{79}$ may be either straight chain or branched groups, but preferably contain from 1 to 5 carbon atoms, and even more preferably from 1 to 3 carbon atoms.

$R^{80}$ to $R^{85}$ each represent, independently, a hydrogen atom, an alkyl group, an alkenyl group, a cycloalkyl group or an aryl group. The alkyl groups of $R^{80}$ to $R^{85}$ may be either straight chain or branched groups, but are preferably alkyl groups of 1 to 10 carbon atoms. The alkenyl groups are preferably alkenyl groups of 1 to 4 carbon atoms.

Examples of the phenol compounds represented by the general formula (e-9) include the compounds represented by the general formula (e-10) shown below.

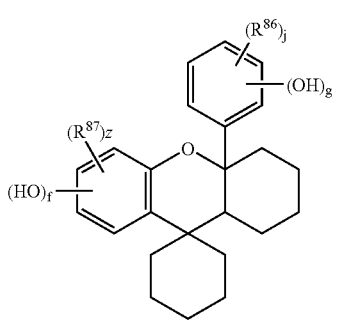
(e-10)

In this formula, $R^{86}$ and $R^{87}$ each represent, independently, an alkyl group. These alkyl groups may be either straight chain or branched groups, but preferably contain from 1 to 5 carbon atoms, and even more preferably from 1 to 3 carbon atoms.

f and g each represent an integer from 1 to 3, and preferably from 1 to 2.

j and z each represent either 0, or an integer from 1 to 3.

More specific examples of the phenol compounds represented by the general formula (e-9) include the compounds represented by the formulas (e-11) and (e-12) shown below.

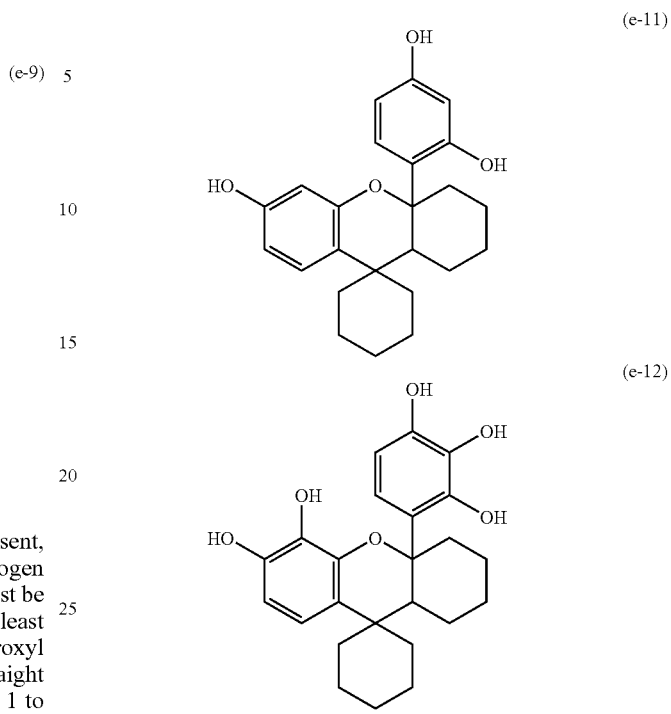

The quantity of the sensitizer is preferably within a range from 1 to 30% by mass, and even more preferably from 3 to 20% by mass, relative to the component (A) or the component (A').

High Boiling Point Solvent

Furthermore in the present invention, by adding an optional organic solvent or solvents selected from a group consisting of high boiling point organic solvents with a boiling point of 200 to 350° C., the bulk effect of the resist film, namely bias within the film density, can be reduced, meaning that even in those cases when the positive photoresist composition is used to form a thick resist film on the surface of a substrate with level differences, a resist pattern with excellent perpendicularity can still be formed. Furthermore, a favorable resist pattern can be formed regardless of the conditions (heating time, heating device and the like) for the prebake treatment and the PEB (post exposure baking) treatment.

Examples of the above high boiling point organic solvents include benzyl acetate, isoamyl salicylate, methyl salicylate, benzyl salicylate, diethyl phthalate, dibutyl phthalate, dimethyl phthalate, γ-butyrolactone, ethyl benzoate, butyl benzoate, propyl benzoate, benzyl benzoate, ethylene glycol monophenyl ether, ethylene glycol monohexyl ether, 1,3-octylene glycol, diethylene glycol, diethylene glycol diacetate, diethylene glycol dibutyl ether, diethylene glycol monoethyl ether, diethylene glycol monoethyl ether acetate, diethylene glycol monobutyl ether, diethylene glycol monobutyl ether acetate, dipropylene glycol, dipropylene glycol monobutyl ether, triethylene glycol, triethylene glycol di-2-ethyl butyrate, triethylene glycol dimethyl ether, triethylene glycol monoethyl ether, triethylene glycol monomethyl ether, tripropylene glycol, tripropylene glycol monomethyl ether, 2-ethylhexanoic acid, caprylic acid, caproic acid, catechol, octylphenol, and N-methylpyrrolidone. These organic solvents may be used singularly, or in combinations of two or more different solvents. Of the above solvents, those with a boiling point within the range from 250 to 350° C. are preferred, and benzyl salicylate is particularly desirable.

The quantity added of the high boiling point organic solvent is typically within a range from 3 to 15% by mass, and preferably from 6 to 12% by mass relative to the combined quantity of the component (A) or the component (A'), and if added, the sensitizer described above. If the quantity is less than 3% by mass, then the effect of the solvent in suppressing the above phenomenon is limited, whereas if the quantity exceeds 15% by mass, then the upper sections of the space pattern tend to expand, causing an undesirable deterioration in the perpendicularity of the cross sectional shape.

Acid Generators

Furthermore, in the present invention, acid generators may also be added if desired. There are no particular restrictions on the acid generators that can be used in the present invention, and any material that decomposes and releases acid on heat treatment or irradiation can be used. Considering application to an actual production process, compounds that generate acid on irradiation with the same i-line radiation (365 nm) as that used by the positive photoresist composition of the present invention are preferred. Examples of such acid generators include the types of triazine based acid generators, oxime sulfonate based acid generators, and onium salt based acid generators disclosed in Japanese Unexamined Patent Application, First Publication No. Hei 5-107755, and of these, 3-(methylsulfonyl)oxy-1,2,3-benzotriazin-4(3H)-one is preferred in terms of providing an excellent acid generating effect under either heat treatment or irradiation, enabling highly efficient cross linking of the cross linking materials, and also having almost no effect on the other characteristics of the positive photoresist composition of the present invention.

The quantity added of the acid generator varies depending on the type of acid generator used, although typical values are within a range from 0.01 to 5.0% by mass, and preferably from 0.1 to 1.0% by mass, relative to the composition (the total solid fraction).

Other Additive Components

In order to further improve the resolution, the exposure margin and the film residual rate, the positive photoresist composition of the present invention may further comprise from about 0.01 to 10% by mass of each of p-toluenesulfonyl chloride (PTSC), 4,4'-bis(diethylamino)benzophenone, 1,4-bis[1-(2-methyl-4-hydroxy-5-cyclohexylphenyl)isopropyl]benzene, and/or 1,3-bis[1-(2-methyl-4-hydroxy-5-cyclohexylphenyl)isopropyl]benzene.

Furthermore, where necessary, the positive photoresist composition of the present invention may also comprise any of a variety of co-soluble additives, provided they are added in quantities that do not impair the objects of the invention. Examples of such additives include ultraviolet absorbers for preventing halation such as 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4'-diethylaminoazobenzene and curcumin; and surfactants for preventing striation including fluorine based surfactants such as Fluorad FC-430 and FC-431 (brand names, manufactured by 3M Japan Co., Ltd.), EFTOP EF122A, EF122B, EF122C and EF126 (brand names, manufactured by Tohkem Products Corporation) and Megafac R-08 (manufactured by Dainippon Ink and Chemicals, Inc.).

The positive photoresist composition of the present invention is preferably used as a solution prepared by dissolving the composition in an appropriate solvent.

Examples of suitable solvents include those solvents conventionally used in positive photoresist compositions, including ketones such as acetone, methyl ethyl ketone, cyclohexanone, methyl isoamyl ketone, and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or the monomethyl ethers, monoethyl ethers, monopropyl ethers, monobutyl ethers or monophenyl ethers of these compounds; cyclic ethers such as dioxane; and esters such as ethyl lactate, methyl acetate, ethyl acetate, butyl acetate, methyl pyruvate, ethyl pyruvate, methyl methoxypropionate, and ethyl ethoxypropionate. These solvents can be used singularly, or in combinations of two or more different solvents. Of the above solvents, ketones such as acetone, methyl ethyl ketone, cyclohexanone, methyl isoamyl ketone, and 2-heptanone; and esters such as ethyl lactate, methyl acetate, ethyl acetate, butyl acetate, methyl pyruvate, ethyl pyruvate, methyl methoxypropionate, and ethyl ethoxypropionate are preferred. Although single solvents may be used, combinations of two or more solvents may also be used.

The quantity used of such solvents, for example in the case in which spin coating is used to form a thick film of at least 10 μm, is preferably sufficient to generate a solid fraction concentration within the solution within a range from 30 to 65% by mass. If the solid fraction concentration is less than 30% by mass, then achieving a thick film of at least 3 μm becomes difficult, whereas if the concentration exceeds 65% by mass, the fluidity of the composition worsens significantly, making handling difficult, and also making it difficult to obtain a uniform resist film using spin coating methods.

Preparation of a positive photoresist composition according to the present invention may be conducted simply by mixing and stirring together each of the components described above using normal methods, or if necessary, by dispersion and mixing using a dispersion device such as a dissolver, a homogenizer or a three roll mill. Furthermore, following mixing of the components, the composition may also be filtered using a mesh or a membrane filter or the like.

A positive photoresist composition of the present invention is ideal for forming a thick film photoresist layer with a film thickness of 3 to 40 μm, and preferably from 3 to 30 μm, and even more preferably from 5 to 20 μm, on a support.

Method of Forming a Resist Pattern

As follows is a description of a preferred example of a method of forming a resist pattern according to the present invention.

First, a solution prepared by dissolving the composition of the present invention in an aforementioned appropriate solvent is applied to the surface of a substrate formed from a material such as Au, Si, or Cu using a spinner or the like, and is then dried to form a photosensitive layer, and this photosensitive layer is then exposed through a desired mask pattern, using a high pressure mercury lamp, an ultra high pressure mercury lamp, or a low pressure mercury lamp as the light source. Where required, a PEB (post exposure baking) treatment is then performed, and the exposed portions of the film are then dissolved and removed by immersing the substrate in a developing liquid, for example, an alkaline aqueous solution such as a 1 to 10% by mass aqueous solution of tetramethylammonium hydroxide (TMAH), thus forming an image which is faithful to the mask pattern.

In those cases where a resist pattern with a high aspect ratio with a width of no more than 0.8 μm is formed under thick film conditions of at least 3 μm, and particularly from 6 to 8 μm, a conventional pattern formation method using an acid cross linking material can also be used if required. Examples of such conventional methods include resist pattern formation methods comprising the steps of: forming a film of an acid cross linking material, which causes a cross linking reaction under the action of acid, across the entire surface of the substrate on which the resist pattern has been drawn, conducting heat treatment so that the action of acid diffusing from the resist pattern surface causes cross linking of the acid cross linking material in those portions contacting the resist pattern, and using a developing liquid to remove the acid cross linking material from those areas that have not undergone cross linking, thereby forming a resist pattern with a narrower space width than that of the resist pattern prior to formation of the acid cross linking material film; and resist pattern formation methods comprising the steps of: forming a film of an acid cross linking material, which causes a cross linking reaction under the action of acid, across the entire surface of the substrate on which the resist pattern has been drawn, generating acid at the surface of, or inside, the resist pattern by conducting either complete exposure or selective exposure of the substrate surface using ultraviolet radiation, conducting heat treatment so that the action of acid diffusing from the resist pattern surface causes cross linking of the acid cross linking material in those portions contacting the resist pattern, and using a developing liquid to remove the acid cross linking material from those areas that have not undergone cross linking, thereby forming a resist pattern with a narrower space width than that of the resist pattern prior to formation of the acid cross linking material film. There are no particular restrictions on the acid cross linking material and the developing liquid used, and suitable examples include the materials disclosed in Japanese Unexamined Patent Application, First Publication No. Hei 11-204399.

A resist pattern produced using a positive photoresist composition of the present invention displays a high level of resolution, and is capable of suppressing pattern broadening and crack generation during the plating process.

Furthermore, with conventional positive photoresist compositions, problems of peelability can arise during formation of a resist pattern is formed, in that complete removal of the resist following developing is difficult, and a residue is often left on the substrate, whereas positive photoresist compositions of the present invention, using either the component (A) or the component (A'), display excellent peelability.

In addition, when the component (A') is used in a positive photoresist composition of the present invention, the composition also displays excellent sensitivity.

EXAMPLES

As follows is a more detailed description of the present invention, based on a series of examples.

Synthetic Example 1

In a 3 L 4-neck flask equipped with a stirrer, a thermometer, and a heat exchanger were placed 1000 parts by mass of a phenol mixture comprising m-cresol and p-cresol in a molar ratio (m-cresol:p-cresol) of 60:40, 465 parts by mass of a 37% aqueous solution of formalin, and 2 parts by mass of oxalic acid, and the resulting mixture was reacted for 4 hours under reflux. Subsequently, the mixture was dewatered at normal pressure up to an internal temperature of 170° C., and then further dewatering and monomer removal were conducted at a reduced pressure of 70 torr up to an internal temperature of 200° C., thus yielding 850 parts by mass of a novolak phenol resin with a weight average molecular weight of 5900.

Subsequently, using the same reaction vessel as described above, 100 parts by mass of the above resin was combined with 26 parts by mass of propylene carbonate and 1 part by mass of potassium carbonate, and the mixture was reacted for 3 hours at 190° C.

The reaction mixture was then neutralized with acetic acid, and acetone and water were added to conduct a water washing treatment to remove any neutral salts, thus yielding 120 parts by mass of a hydroxyalkyl ether modified phenol resin A represented by a formula (IV) shown below, with a weight average molecular weight of 6500. This resin A had a ratio x:y=30:70 in the formula (IV). This ratio (x:y) was calculated from the reaction rate of the aforementioned novolak phenol resin and the hydroxyalkyl etherification agent.

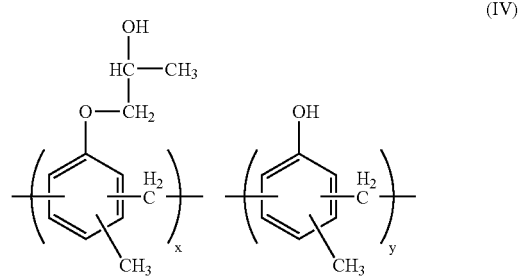

(IV)

Synthetic Example 2

In a 3 L 4-neck flask equipped with a stirrer, a thermometer, and a heat exchanger were placed 1000 parts by mass of a phenol mixture comprising m-cresol and p-cresol in a molar ratio (m-cresol:p-cresol) of 35:65, 443 parts by mass of a 37% aqueous solution of formalin, and 2 parts by mass of oxalic acid, and the resulting mixture was reacted for 4 hours under reflux. Subsequently, the mixture was dewatered at normal pressure up to an internal temperature of 170° C., and then further dewatering and monomer removal were conducted at a reduced pressure of 70 torr up to an internal temperature of 200° C., thus yielding 720 parts by mass of a novolak phenol resin with a weight average molecular weight of 3300.

Subsequently, using the same reaction vessel as described above, 100 parts by mass of the above resin was combined with 4 parts by mass of propylene carbonate and 1 part by mass of potassium carbonate, and the mixture was reacted for 3 hours at 190° C. The reaction mixture was then neutralized with acetic acid, and acetone and water were added to conduct a water washing treatment to remove any neutral salts, thus yielding 100 parts by mass of a hydroxyalkyl ether modified phenol resin B of the formula (IV) above, with a weight average molecular weight of 3500. This resin B had a ratio x:y=5:95 in the formula (IV).

Synthetic Example 3

In a 3 L 4-neck flask equipped with a stirrer, a thermometer, and a heat exchanger were placed 1000 parts by mass of a phenol mixture comprising m-cresol and p-cresol in a molar ratio (m-cresol:p-cresol) of 75:25, 458 parts by mass of a 37% aqueous solution of formalin, and 2 parts by mass of oxalic acid, and the resulting mixture was reacted for 4 hours under reflux. Subsequently, the mixture was dewatered at normal pressure up to an internal temperature of 170° C., and then further dewatering and monomer removal were conducted at a reduced pressure of 70 torr up to an internal temperature of 200° C., thus yielding 920 parts by mass of a novolak phenol resin with a weight average molecular weight of 3000.

Subsequently, using the same reaction vessel as described above, 100 parts by mass of the above resin was combined with 60 parts by mass of propylene carbonate and 1 part by mass of potassium carbonate, and the mixture was reacted for 3 hours at 190° C.

The reaction mixture was then neutralized with acetic acid, and acetone and water were added to conduct a water washing treatment to remove any neutral salts, thus yielding 150 parts by mass of a hydroxyalkyl ether modified phenol resin C of the formula (IV) above, with a weight average molecular weight of 3200. This resin C had a ratio x:y=70:30 in the formula (IV).

Synthetic Example 4

50 g of the hydroxyalkyl ether modified phenol resin A of weight average molecular weight 6500 (x:y=30:70) prepared in the synthetic example 1, and 4 g (0.015 mols) of 1,2-naphthoquinonediazide-4-sulfonyl chloride were placed in a 1 liter 3-neck flask equipped with a thermometer, a stirrer and a dropping funnel, and following the addition of 162 g of dioxane to dissolve the mixture, 3.0 g (0.030 mols) of triethylamine was added from the dropping funnel, and the resulting mixture was stirred for 1 hour at room temperature.

Subsequently, 1.63 g (0.045 mols) of hydrochloric acid was added, and following stirring for a further 30 minutes at room temperature, the reaction mixture was filtered to yield a red-brown colored liquid.

This liquid was added, with constant stirring, to a 2 liter beaker containing 1 liter of pure water, thus precipitating the product.

The precipitate was collected by filtration, and the thus obtained solid was dissolved in propylene glycol methyl ether acetate, and the solution was concentrated, thus yielding a solution of a hydroxyalkyl ether modified phenol resin D in which 3.8 mol % of all the hydroxyl groups had been substituted with 1,2-naphthoquinonediazidesulfonyl groups.

Comparative Synthetic Example 1

In a 3 L 4-neck flask equipped with a stirrer, a thermometer, and a heat exchanger were placed 1000 parts by mass of a phenol mixture comprising m-cresol and p-cresol in a molar ratio (m-cresol:p-cresol) of 60:40, 465 parts by mass of a 37% aqueous solution of formalin, and 2 parts by mass of oxalic acid, and the resulting mixture was reacted for 4 hours under reflux. Subsequently, the mixture was dewatered at normal pressure up to an internal temperature of 170° C., and then further dewatering and monomer removal were conducted at a reduced pressure of 70 torr up to an internal temperature of 190° C., thus yielding 860 parts by mass of a novolak phenol resin E with a weight average molecular weight of 4500. This resin E had a ratio x:y=0:100 in the formula (IV).

Example 1

100 parts by mass of the component (A) and 17 parts by mass of the component (B) listed below were dissolved in 143 parts by mass of propylene glycol methyl ether acetate, and the solution was then filtered through a membrane filter, yielding a positive photoresist composition.

Component (A): the hydroxyalkyl ether modified phenol resin A of the synthetic example 1.

Component (B): a photosensitizer comprising 1-[1-(4-hydroxyphenyl)isopropyl]-4-[1,1-bis(4-hydroxyphenyl)ethyl]benzene in which 2 mols of all the hydroxyl groups had been substituted with 1,2-naphthoquinonediazide-4-sulfonyl groups.

Example 2

With the exception of changing the component (B) from the example 1 to a photosensitizer comprising bis(5-cyclohexyl-4-hydroxy-2-methylphenyl)-3,4-dihydroxyphenylmethane in which 2 mols of all the hydroxyl groups had been substituted with 1,2-naphthoquinonediazide-4-sulfonyl groups, a positive photoresist composition was prepared in a similar manner to the example 1.

Example 3

With the exception of replacing the hydroxyalkyl ether modified phenol resin A from the example 1 with the hydroxyalkyl ether modified phenol resin B, a positive photoresist composition was prepared in a similar manner to the example 1.

Example 4

With the exception of replacing the hydroxyalkyl ether modified phenol resin A from the example 1 with the hydroxyalkyl ether modified phenol resin C, a positive photoresist composition was prepared in a similar manner to the example 1.

Example 5

100 parts by mass of the component (A) listed below was dissolved in 123 parts by mass of propylene glycol methyl ether acetate, and the solution was then filtered through a membrane filter, yielding a positive photoresist composition.

Component (A): the hydroxyalkyl ether modified phenol resin D of the synthetic example 4.

Example 6

100 parts by mass of the component (A), 17 parts by mass of the component (B), and 5 parts by mass of the component (C) listed below were dissolved in 155 parts by mass of propylene glycol methyl ether acetate, and the solution was then filtered through a membrane filter, yielding a positive photoresist composition.

Component (A): the hydroxyalkyl ether modified phenol resin A of the synthetic example 1.

Component (B): a photosensitizer comprising bis(5-cyclohexyl-4-hydroxy-2-methylphenyl)-3,4-dihydroxyphenylmethane in which 2 mols of all the hydroxyl groups had been substituted with 1,2-naphthoquinonediazide-4-sulfonyl groups.

Component (C): an alkali-soluble acrylic resin prepared in the following manner: a flask equipped with a stirrer, a reflux condenser, a thermometer, and a dropping funnel was flushed with nitrogen, 200 g of propylene glycol methyl ether acetate was added as the solvent, stirring was started, and then the temperature of the solvent was raised to 80° C. The dropping funnel was filled with 0.5 g of 2,2'-azobisisobutyronitrile as a polymerization catalyst, 130 g of 2-methoxyethyl acrylate, 50.0 g of benzyl methacrylate, and 20.0 g of acrylic acid, and this mixture was stirred until the polymerization catalyst had dissolved. The resulting solution was then added in a constant, dropwise manner to the flask over a period of 3 hours, and following completion of the addition, the polymerization reaction was continued for a further 5 hours at 80° C., before the mixture was cooled to room temperature to yield the alkali-soluble acrylic resin.

Comparative Example 1

100 parts by mass of the component (A') and 17 parts by mass of the component (B) listed below were dissolved in 143 parts by mass of propylene glycol methyl ether acetate, and the solution was then filtered through a membrane filter, yielding a positive photoresist composition.

Component (A'): the novolak phenol resin E of the comparative synthetic example 1.

Component (B): a photosensitizer comprising bis(5-cyclohexyl-4-hydroxy-2-methylphenyl)-3,4-dihydroxyphenylmethane in which 2 mols of all the hydroxyl groups had been substituted with 1,2-naphthoquinonediazide-4-sulfonyl groups.

Comparative Example 2

100 parts by mass of the component (A'), 17 parts by mass of the component (B), and 17 parts by mass of the component (C) listed below were dissolved in 190 parts by mass of propylene glycol methyl ether acetate, and the solution was then filtered through a membrane filter, yielding a positive photoresist composition.

Component (A'): the novolak phenol resin E of the comparative synthetic example 1.

Component (B): a photosensitizer comprising bis(5-cyclohexyl-4-hydroxy-2-methylphenyl)-3,4-dihydroxyphenylmethane in which 2 mols of all the hydroxyl groups had been substituted with 1,2-naphthoquinonediazide-4-sulfonyl groups.

Component (C): the component (C) used in the example 6.

Test Example 1

The properties of each of the positive photoresist compositions prepared in the examples 1 to 6 and the comparative examples I and 2 were determined in the manner descried below. The results are shown in Table 1.

(Evaluation of Resolution 1)

A solution of the photoresist composition was applied to the surface of a 5-inch gold wafer using a spinner, and the solution was then subjected to prebaking by heating on a hotplate at 110° C. for 6 minutes, thus yielding a film of thickness 20 µm. Subsequently, using a mask with a square exposure pattern and an ultra high pressure mercury lamp (USH-250D, manufactured by Ushio Inc.), the film was exposed, and then developed using a developing liquid (P-7G, from the PMER series, manufactured by Tokyo Ohka Kogyo Co., Ltd.). The exposed film was inspected under a microscope, and if the 20 µm square pattern was resolvable, the film was evaluated as Good, whereas if the pattern was not resolvable the film was evaluated as Bad.

(Evaluation of Resolution 2)

Exposure and developing were conducted in the same manner as described above in "evaluation of resolution 1", and the ratio (D2/D1) between the dimensions (D2) of the generated 40 µm square exposure pattern, and the original 40 µm mask dimensions (D1) was calculated. Ratios D2/D1<1.06 were evaluated as Good, ratios $1.06 \leq D2/D1<1.10$ were evaluated as Fair, and ratios $1.10 \leq D2/D1$ were evaluated as Bad.

(Evaluation of Sensitivity)

Exposure and developing were conducted in the same manner as described above in "evaluation of resolution 1", and if the exposure dose E for resolving the 40 µm mask was E<1500 mJ/cm$^2$ the film was evaluated as Excellent, whereas if 1500 mJ/cm$^2 \leq$E, the film was evaluated as Good.

(Evaluation of Plating Resistance 1: Evaluation of Plating Broadening)

Exposure and developing were conducted in the same manner as described above in "evaluation of resolution 1", and a plating treatment was then conducted for 40 minutes at 65° C., using an electroplating method using a non-cyanide gold sulfite plating solution. The ratio between the dimensions (D3) of the 40 µm exposure pattern measured following this plating treatment, and the aforementioned D2 was calculated, and ratios D3/D2<1.03 were evaluated as Good, ratios $1.03 \leq D2/D1<1.05$ were evaluated as Fair, and ratios $1.05 \leq D3/D2$ were evaluated as Bad.

(Evaluation of Plating Resistance 2: Evaluation of Cracking)

Plating was conducted in the same manner as described above in the above plating evaluation, and films in which no cracking had occurred around the pattern were evaluated as Good, films in which cracking had occurred only in the area surrounding the pattern were evaluated as Fair, and films in which cracks spanned the distance between adjacent sections of the pattern were evaluated as Bad.

(Evaluation of Peelability)

Plating was conducted in the same manner as described above in the above plating evaluation, and the wafer was then immersed in acetone for 5 minutes at room temperature to remove the resist from the wafer. The substrate interface of the plated sections was then inspected using a scanning electron microscope (SEM), and samples in which resist residue existed were evaluated as Bad, whereas those with no resist residue were evaluated as Good.

TABLE 1

|  | Resolution evaluation 1 | Resolution evaluation 2 | Sensitivity evaluation | Plating resistance evaluation 1 | Plating resistance evaluation 2 | Peelability evaluation |
|---|---|---|---|---|---|---|
| Example 1 | Good | Fair | Good | Good | Good | Good |
| Example 2 | Good | Fair | Good | Good | Good | Good |
| Example 3 | Good | Good | Good | Good | Fair | Good |
| Example 4 | Good | Fair | Good | Fair | Good | Good |
| Example 5 | Good | Good | Excellent | Fair | Fair | Good |
| Example 6 | Good | Fair | Good | Fair | Good | Good |

TABLE 1-continued

|  | Resolution evaluation 1 | Resolution evaluation 2 | Sensitivity evaluation | Plating resistance evaluation 1 | Plating resistance evaluation 2 | Peelability evaluation |
|---|---|---|---|---|---|---|
| Comparative example 1 | Good | Good | Good | Good | Bad | Good |
| Comparative example 2 | Good | Bad | Good | Bad | Good | Bad |

As shown in Table 1, the resist patterns using the positive photoresist compositions of the examples 1 to 5 displayed good resolution, and minimal plating broadening or occurrence of cracking. Furthermore, the sensitivity and the peelability were also favorable. The resist pattern formed using the positive photoresist composition of the example 5, in which the component (A) comprised a resin in which a portion of the hydrogen atoms of the hydroxyl groups had been substituted with 1,2-naphthoquinonediazidesulfonyl groups, displayed particularly superior sensitivity despite the lack of a component (B).

In contrast, the resist pattern formed using the positive photoresist composition of the comparative example 1, which used the component (A') containing none of the structural units (a1) as the base resin, displayed marked cracking. Furthermore, the resist pattern formed using the positive photoresist composition of the comparative example 2, which comprised the positive photoresist composition of the comparative example 1 with an additional alkali-soluble acrylic resin, displayed a reduced level of cracking, although the resolution was poor, plating broadening was marked, and the peelability had deteriorated.

INDUSTRIAL APPLICABILITY

By using a positive photoresist composition of the present invention, a resist pattern can be formed that displays excellent resolution and good suppression of crack generation during plating, and pattern broadening of the plated pattern can also be reduced.

The invention claimed is:

1. A positive photoresist composition comprising an alkali-soluble novolak resin (A) containing a structural unit (a1) represented by a general formula (I) shown below:

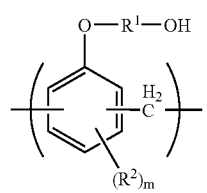

[wherein, $R^1$ represents an alkylene group of 1 to 5 carbon atoms, $R^2$ represents a hydrogen atom, a hydroxyl group, or an alkyl group of 1 to 4 carbon atoms, and m represents an integer of 1 to 3], and a structural unit (a2) represented by a general formula (II) shown below:

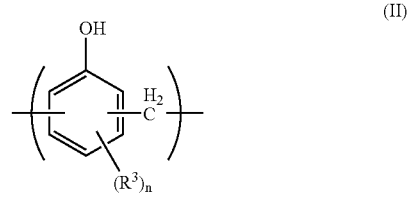

[wherein, $R^3$ represents a hydrogen atom, a hydroxyl group, or an alkyl group of 1 to 4 carbon atoms, and n represents an integer of 1 to 3], and a photosensitizer (B).

2. A positive photoresist composition comprising an alkali-soluble novolak resin (A') containing a structural unit (a1) represented by a general formula (I) shown below:

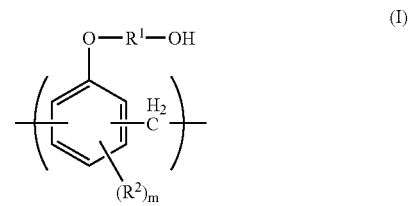

[wherein, $R^1$ represents an alkylene group of 1 to 5 carbon atoms, $R^2$ represents a hydrogen atom, a hydroxyl group, or an alkyl group of 1 to 4 carbon atoms, and m represents an integer of 1 to 3], and a structural unit (a2) represented by a general formula (II) shown below:

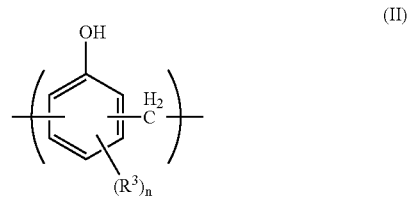

[wherein, $R^3$ represents a hydrogen atom, a hydroxyl group, or an alkyl group of 1 to 4 carbon atoms, and n represents an integer of 1 to 3], wherein a portion of hydrogen atoms of said hydroxyl groups contained within said resin are substituted with 1,2-naphthoquinonediazidesulfonyl groups.

3. A positive photoresist composition according to claim 2, further comprising a photosensitizer (B).

4. A method of forming a resist pattern comprising the steps of applying a positive photoresist composition according to any one of claim 1 through claim 3 to a substrate, conducting a prebake, performing selective exposure, and then performing alkali developing to farm the resist pattern.

* * * * *